(12) United States Patent
Walter et al.

(10) Patent No.: US 9,188,625 B2
(45) Date of Patent: Nov. 17, 2015

(54) SEMICONDUCTOR DEVICE TEST STRUCTURES AND METHODS

(71) Applicant: Infineon Technologies AG, Neubiberg (DE)

(72) Inventors: Wolfgang Walter, Kaufbeuren (DE); Klaus Koller, Germering (DE)

(73) Assignee: Infineon Technologies AG, Neubiberg (DE)

( * ) Notice: Subject to any disclaimer, the term of this patent is extended or adjusted under 35 U.S.C. 154(b) by 20 days.

(21) Appl. No.: 14/098,210

(22) Filed: Dec. 5, 2013

(65) Prior Publication Data

US 2014/0097864 A1   Apr. 10, 2014

Related U.S. Application Data

(62) Division of application No. 12/949,088, filed on Nov. 18, 2010, now Pat. No. 8,633,482, which is a division of application No. 11/702,975, filed on Feb. 6, 2007, now Pat. No. 7,858,406.

(51) Int. Cl.
*G01R 31/26* (2014.01)
*G01R 31/28* (2006.01)
*H01L 21/66* (2006.01)
*H01L 23/58* (2006.01)

(52) U.S. Cl.
CPC ........ *G01R 31/2607* (2013.01); *G01R 31/2858* (2013.01); *H01L 22/34* (2013.01); *H01L 23/585* (2013.01); *H01L 2924/0002* (2013.01)

(58) Field of Classification Search
CPC ........... G01R 31/2858; G01R 31/2607; H01L 22/34; H01L 23/585
USPC ............................... 438/17, 18, 468
See application file for complete search history.

(56) References Cited

U.S. PATENT DOCUMENTS

| | | | |
|---|---|---|---|
| 5,625,232 | A | 4/1997 | Numata et al. |
| 5,625,288 | A | 4/1997 | Snyder et al. |
| 5,675,187 | A | 10/1997 | Numata et al. |
| 5,811,352 | A | 9/1998 | Numata et al. |

(Continued)

FOREIGN PATENT DOCUMENTS

| | | |
|---|---|---|
| DE | 19710471 A1 | 5/1998 |
| DE | 10254756 A1 | 6/2004 |

(Continued)

OTHER PUBLICATIONS

Chiang, T.-Y., et al., "Analytical Thermal Model for Multilevel VLSI Interconnects Incorporating Via Effect," IEEE Electron Device Letters, Jan. 2002, pp. 31-33, vol. 23, No. 1, IEEE, Los Alamitos, CA.

(Continued)

*Primary Examiner* — William F Kraig
*Assistant Examiner* — Sun M Kim
(74) *Attorney, Agent, or Firm* — Slater & Matsil, L.L.P.

(57) ABSTRACT

Semiconductor device test structures and methods are disclosed. In a preferred embodiment, a test structure includes a feed line disposed in a first conductive material layer, and a stress line disposed in the first conductive material layer proximate the feed line yet spaced apart from the feed line. The stress line is coupled to the feed line by a conductive feature disposed in at least one second conductive material layer proximate the first conductive material layer.

15 Claims, 8 Drawing Sheets

(56) References Cited

U.S. PATENT DOCUMENTS

| | | |
|---|---|---|
| 5,900,735 A | 5/1999 | Yamamoto |
| 6,320,391 B1 | 11/2001 | Bui |
| 6,598,182 B1 | 7/2003 | Lowitz et al. |
| 6,603,321 B2 | 8/2003 | Filippi, Jr. et al. |
| 6,784,000 B2 | 8/2004 | Sikora et al. |
| 6,819,124 B1 | 11/2004 | Allee et al. |
| 6,822,437 B1 | 11/2004 | Hau-Riege et al. |
| 6,822,473 B1 | 11/2004 | Hau-Riege et al. |
| 6,919,639 B2 | 7/2005 | Ho et al. |
| 6,940,720 B2 | 9/2005 | Fischer et al. |
| 6,995,392 B2 | 2/2006 | McLaughlin et al. |
| 7,096,450 B2 | 8/2006 | Gill et al. |
| 7,397,260 B2 * | 7/2008 | Chanda et al. .............. 257/48 |
| 7,858,406 B2 * | 12/2010 | Walter et al. .............. 438/18 |
| 8,633,482 B2 * | 1/2014 | Walter et al. .............. 257/48 |
| 2004/0036495 A1 | 2/2004 | Fazekas et al. |
| 2005/0211980 A1 | 9/2005 | Fischer et al. |
| 2007/0278484 A1 | 12/2007 | Feustel et al. |

FOREIGN PATENT DOCUMENTS

| | | |
|---|---|---|
| JP | 2000174085 A | 6/2000 |
| JP | 2000223489 | 8/2000 |
| KR | 20030050651 A | 6/2003 |
| TW | 432217 | 5/2001 |
| TW | 200300055 | 5/2003 |

OTHER PUBLICATIONS

"Electromigration," Wikipedia, the Free Encyclopedia, http://en.wikipedia.org/wiki/Electromigration, downloaded Jan. 5, 2007, 11 pp., Wikimedia Foundation Inc., St. Petersburg, FL.

Schindler, G., et al., "Recent Advances for Nano Interconnects: Conductor Reliability and Resistivity," Proceedings of the Advanced Metallization Conference (AMC) 2002, 7 pages.

Von Glasow, A., et al., "Using the Temperature Coefficient of the Resistance (TCR) as Early Reliability Indicator for Stressvoiding Risks in Cu Interconnects," 2003 International Reliability Physics Symposium, Apr. 1, 2003, 6 pages, IEEE, Dallas, TX.

* cited by examiner

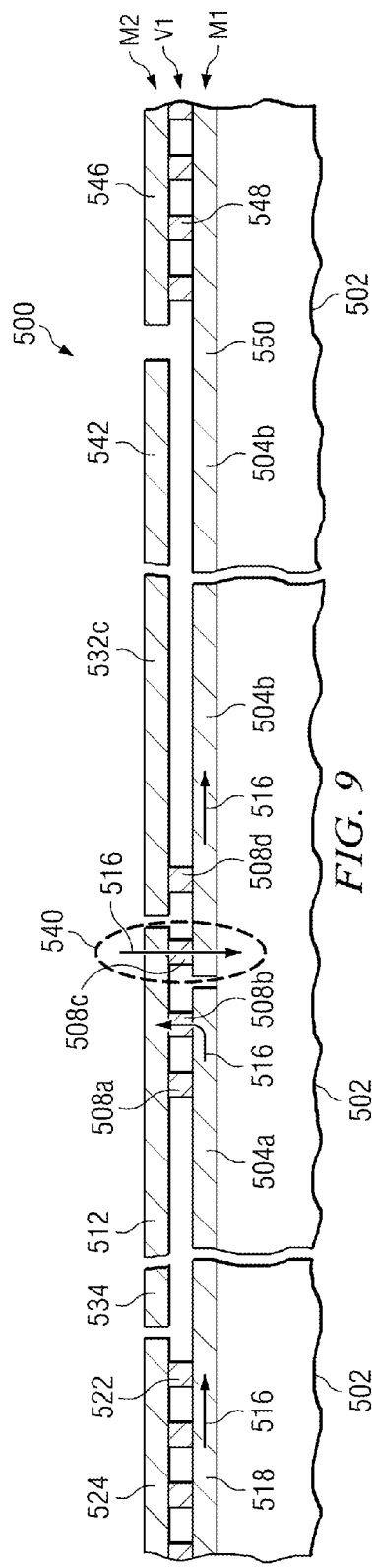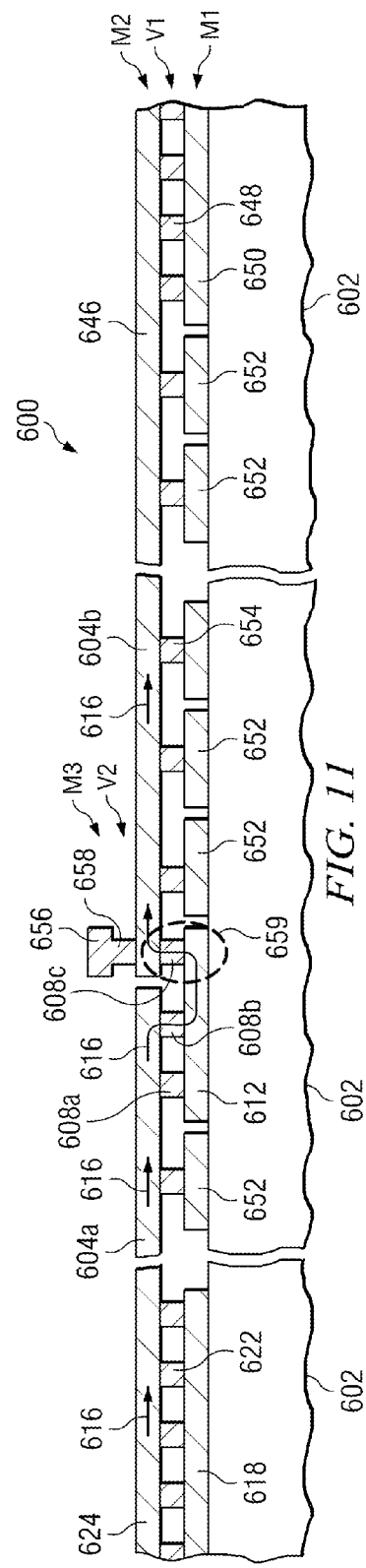

SEMICONDUCTOR DEVICE TEST STRUCTURES AND METHODS

This application is a divisional of patent application Ser. No. 12/949,088, filed on Nov. 18, 2010, which is a divisional of patent application Ser. No. 11/702,975, filed on Feb. 6, 2007, which issued as U.S. Pat. No. 7,858,406, both of these applications are incorporated herein by reference in entirety.

TECHNICAL FIELD

The present invention relates generally to the fabrication of semiconductor devices, and more particularly to test structures and methods for semiconductor devices.

BACKGROUND

Generally, semiconductor devices are used in a variety of electronic applications, such as computers, cellular phones, personal computing devices, and many other applications. Home, industrial, and automotive devices that in the past comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's). There may be a plurality of transistors, memory devices, switches, conductive lines, diodes, capacitors, logic circuits, and other electronic components formed on a single die or chip.

Semiconductor devices typically include one or more metallization layers that are usually formed in the upper material layers in a back end of the line (BEOL) of the fabrication process. The metallization layers include conductive lines comprised of conductive materials such as aluminum (Al), copper (Cu), and other metals, which are separated from other conductive lines by an insulating material such as silicon dioxide ($SiO_2$).

Electromigration is a phenomenon that occurs in conductive materials that can become problematic in semiconductor devices having small conductive features. Electromigration is the transport of material caused by the gradual movement of atoms in a conductive material, due to a momentum transfer between conducting electrons and diffusing metal atoms. Electromigration occurs when electrons transfer momentum to atoms, which cause the atoms to move from their original positions.

Over time, the movement of atoms from their original positions due to electromigration can cause a break or gap in the conductive material, preventing or hindering the flow of electrical current. In narrow interconnect conductors, such as conductive lines linking transistors and other components in integrated circuits, this is known as a void or internal failure open circuit. Electromigration can also cause the atoms of a conductor to pile up and drift toward other nearby conductors, creating an unintended electrical connection known as a hillock or whisker failure, or a short circuit. Both voids and hillock failures can lead to a malfunction of an integrated circuit.

Electromigration is particularly a problem in applications where high direct current densities are used. With increasing miniaturization, the probability of failure due to electromigration increases in semiconductor devices, because smaller conductive lines have increased power density and current density. Electromigration can lead to the eventual loss of one or more connections, and to the intermittent failure and/or eventually permanent failure of an entire circuit.

Electromigration is an inherent limitation for very large scale integration (VLSI) interconnect systems, because electromigration reliability issues limit current density increase in ever-shrinking VLSI circuitry. Electromigration performance testing is consequently a very important factor during the development of technology and also in the manufacturing process of semiconductor devices. One key cost issue facing semiconductor device designers is the acceleration of electromigration testing times, which currently may range from several hours to several days, for example.

Temperature and current density are two factors involved in the acceleration of electromigration testing times. Both factors are limited: increased temperature can initiate other non-electromigration degradation mechanisms, while increased current density tends to cause temperature inhomogeneities in test structures, deteriorating or inhibiting the electromigration assessment. Temperature inhomogeneities are especially pronounced in test structures involving both conductive lines and vias or contacts, for example. Via and contact issues may be independent from conductive line issues and have become critical issues for Cu and AlCu interconnect systems, for example.

Thus, what are needed in the art are improved structures and methods for testing electromigration in semiconductor devices.

SUMMARY OF THE INVENTION

These and other problems are generally solved or circumvented, and technical advantages are generally achieved, by preferred embodiments of the present invention, which provide improved structures and methods for testing and measuring electromigration in semiconductor devices.

In accordance with a preferred embodiment of the present invention, a test structure includes a feed line disposed in a first conductive material layer, and a stress line disposed in the first conductive material layer proximate the feed line yet spaced apart from the feed line. The stress line is coupled to the feed line by a conductive feature disposed in at least one second conductive material layer proximate the first conductive material layer.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 9 is a cross-sectional view of the embodiment shown in FIG. 8;

FIG. 11 is a cross-sectional view of the embodiment shown in FIG. 10;

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 1:
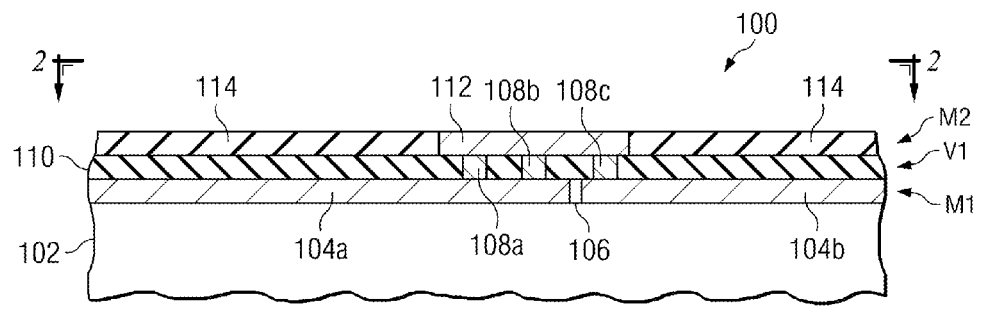
FIG. 1 is a cross-sectional view of a test structure of a semiconductor device in accordance with a preferred embodiment of the present invention, wherein a feed line is formed in the same conductive material layer as a stress line for an electromigration test, and wherein the feed line and stress line are coupled together by a link in an adjacent conductive material layer.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Conventional via-line test structures for measuring electromigration typically comprise a feed line for supplying current that is disposed in a different conductive material layer than the conductive material layer the stress line is formed in, which is used for making measurements of electromigration. The feed line is connected to the stress line for the electromigration measurements by one or more vias. In order to accelerate the test time of such conventional test structures, the test current is often increased; however, increasing the amount of current causes Joule's heating, which tends to be non-uniform. Forming the feed line in a different conductive material layer than the stress line is formed in results in an inferior electromigration test structure, because fluctuating processing parameters for the two conductive material layers may cause unrelated variations in the size, e.g., in the widths and heights of the stress line and the feed line. Such a variation in the size of the stress line and the feed line may create unpredictable temperature inhomogeneities in the test structure. Unpredictable inhomogeneities may also originate from process variations with respect to dielectric layer thicknesses.

For example, the temperature of the via connecting the stress line and the feed line can be higher or lower than in the stress line and may not be predictable due to process variations. The via between the stress line and the feed line is smaller than the stress line and feed line, and has a higher resistance than the feed line and stress line, resulting in hot spots at the via site. On the other hand, the temperature of the feed line is typically significantly less than the temperature of the stress line, e.g., about 50% less in some conventional test structures. A low feed line temperature impacts the via temperature. The decreased temperature of the feed line in comparison to the stress line may be caused by a greater width of the feed line, closer proximity of the feed line to the substrate, or process variations in the manufacture of the two conductive material layers of the test structure that the feed line and stress line are formed in, for example.

The inhomogeneous temperature profile of such conventional electromigration test structures can hide or pronounce via failures and can inhibit a quantitative electromigration assessment of a semiconductor device. Thus, improved structures and methods for testing electromigration in semiconductor devices are needed in the art.

Embodiments of the present invention provide novel test methods and test structures that may be used to effectively and quickly measure and test electromigration effects in semiconductor devices.

Figure 2:
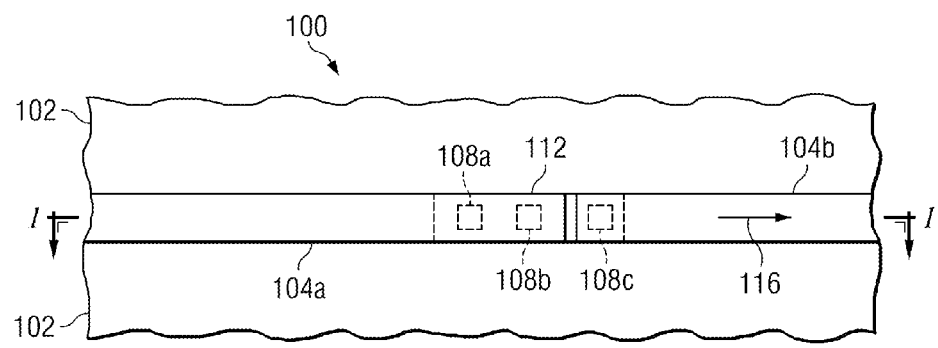
FIG. 2 is a top view of the test structure shown in FIG. 1.

FIG. 1 is a cross-sectional view of a test structure 100 of a semiconductor device in accordance with a preferred embodiment of the present invention, wherein a feed line 104a is formed in the same conductive material layer M1 as a stress line 104b for an electromigration test. The feed line 104a and the stress line 104b are coupled together by a link 112 disposed in an adjacent conductive material layer M2. FIG. 2 shows a top view of the test structure 100 shown in FIG. 1. To operate the test structure 100, a current 116 (note that in the figures, the arrow representing current 116 indicates the direction of electron flow in embodiments of the present invention described herein) is run through the stress line 104b using the feed line 104a, and properties of the stress line 104b such as resistance and voltage drop are measured to determine the amount of electromigration in the semiconductor device the test structure 100 is formed in.

To manufacture the test structure 100, first, a workpiece 102 is provided. The workpiece 102 may include a semiconductor substrate comprising silicon or other semiconductor materials covered by an insulating layer, for example. The workpiece 102 may also include other active components or circuits formed in other regions of the device, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) substrate, for example.

A first conductive material layer M1 is formed over the workpiece 102, as shown. The first conductive material layer M1 preferably comprises a material layer where conductive lines for an integrated circuit (not shown) are formed, e.g., in a BEOL process, for example. The first conductive material layer M1 may comprise an interconnect layer or metallization layer, as examples. The first conductive material layer M1 may comprise a first-formed interconnect layer of a multi-layer interconnect structure of a semiconductor device, or alternatively may comprise an upper interconnect or metallization layer of a semiconductor device, for example.

The test structure 100 includes a feed line 104a and a stress line 104b formed in the first conductive material layer M1. The feed line 104a and the stress line 104b are separated from one another and from other conductive lines of the semiconductor device formed in the first conductive material layer M1 by a first insulating material 106. The first insulating material 106 may comprise an interlayer dielectric (ILD) material 106, which may comprise an insulator such as $SiO_2$ or other insulating materials, such as low dielectric constant (k) materials having a k value less than the k value of $SiO_2$, as examples.

The feed line 104a is also referred to herein as a first conductive line, and the stress line 104b is also referred to herein as a second conductive line, for example. The feed line 104a is used to supply a current to the stress line 104b, and the stress line 104b is used to take measurements of electromigration, to be described further herein.

Next, a plurality of vias 108a, 108b, and 108c are formed over the feed line 104a and the stress line 104b. The vias 108a, 108b, and 108c may also comprise contacts and are formed in a second conductive material layer V1 of the semiconductor device, for example. Other vias may be formed elsewhere within the conductive material layer V1 in the semiconductor device, for example, not shown. The second conductive material layer V1 may comprise a first-formed via interconnect level of a multi-level interconnect structure, or alternatively, may comprise an upper via interconnect or metallization layer, for example.

The vias 108a, 108b, and 108c comprise at least one first via 108a and 108b coupled to the feed line 104a and at least one second via 108c coupled to the stress line 104b, as shown. The at least one second via 108c is also referred to herein as a stressed via, e.g., because the at least one second via 108c is adjacent to and directly abuts the stress line 104b that is used for electromigration measurements, for example. The at least one first via 108a and 108b is also referred to herein as an "at least one first conductive via," and the at least one second via 108c is also referred to herein as an "at least one second conductive via," for example.

There may be one or more first vias 108a or 108b coupled to the feed line 104a and one or more second vias 108c coupled to the stress line 104b, although two first vias 108a or 108b and one second via 108c are shown in FIGS. 1 and 2, for example. The vias 108a, 108b, and 108c are separated from one another by an insulating material 110, which may comprise a similar material as previously described for the insulating material 106 of the first conductive material layer M1, for example.

A link 112 is formed over the plurality of vias 108a, 108b, and 108c, as shown in FIGS. 1 and 2. The link 112 and the vias 108a, 108b, and 108c couple together the feed line 104a and the stress line 104b. For example, the link 112 is preferably coupled at one end to the at least one first via 108a or 108b and at another opposite end to the at least one second via 108c. The link 112 and the vias 108a, 108b, and 108c are also collectively referred to herein as a conductive feature, for example.

The link 112 is preferably formed in a third conductive material layer M2 of the semiconductor device. Other conductive lines may be formed elsewhere within the conductive material layer M2 in the semiconductor device, for example, not shown. The link 112 is also referred to herein as a third conductive line, for example. The link 112 is separated from other conductive structures in the third conductive material layer M2 by an insulating material 114, which may comprise similar materials as previously described for the insulating material 106 of the first conductive material layer M1, for example. The third conductive material layer M2 may comprise a second-formed interconnect layer of conductive lines, or alternatively may comprise an upper interconnect or metallization layer of a multi-layer interconnect structure, for example.

The third conductive material layer M2 may comprise the same thickness as the first conductive material layer M1, in some embodiments. Alternatively, the third conductive material layer M2 may comprise a thickness different than the thickness of the first conductive material layer M1, for example. The second conductive material layer V1 may also comprise the same thickness or a different thickness as the first conductive material layer M1, for example.

The first, second, and third conductive material layers M1, V1, and M2 may also comprise other metallization layers within the semiconductor device, e.g., formed in upper metallization layers of the device; e.g., Mx, Vx, and M(x+1) interconnect levels. The link 112 may alternatively be formed below the feed line 104a and the stress line 104b, e.g., in interconnect levels Mx, V(x−1), and M(x−1), to be described further herein.

The feed line 104a, stress line 104b, vias 108a, 108b, and 108c, and the link 112 may be formed using damascene techniques, e.g., by depositing the insulating materials 106, 110, and 114, patterning the insulating materials 106, 110, and 114, and filling in the patterned insulating materials 106, 110, and 114 with a conductive material. The excess conductive material is removed from over the insulating materials 106, 110, and 114 using a chemical-mechanical polish (CMP) process and/or etch process, as examples. Alternatively, the feed line 104a, stress line 104b, vias 108a, 108b, and 108c, and link 112 may be formed using subtractive techniques, e.g., by depositing a conductive material, patterning the conductive material, and depositing the insulating materials 106, 110, and 114 between the feed line 104a, stress line 104b, vias 108a, 108b, and 108c, and link 112.

The novel test structure 100 advantageously eliminates temperature gradients and variations in the test structure 100 by forming a feed line 104a in same conductive material layer M1 as the stress line 104b, ensuring that the feed line 104a and the stress line 104b comprise the same widths and heights. Thus, the amount of resistance of the feed line 104a and the stress line 104b is uniform per unit length of the feed line 104a and stress line 104b, resulting in a uniform heat deposition per unit length for both the feed line 104a and the stress line 104b during electromigration stress. Also, the heat dissipation per unit length is uniform for both the feed line 104a and the stress line 104b. The test structure 100 achieves temperature homogeneity of the feed line 104a and the stress line 104b by identicality: the feed line 104a and the stress line 104b have the same cross-sectional dimensions (width and height) because they are formed in the same conductive material layer M1. Also, the heat dissipation per length unit is identical, because of the identically of the top and bottom dielectric and conductive material layers.

Electromigration in the feed line 104a of the novel test structure 100 may be eliminated by heatsinking the left side of the feed line 104a and by selecting an appropriate length of the feed line 104a, for example. The length of the feed line 104a may comprise about 50 μm, or about 20 to 80 μm, for example, in some applications, although the feed line 104a may alternatively comprise other dimensions. Thus, the length of the feed line 104 functions as a "thermal length" to ensure that the right side of the feed line 104a is nearly at its asymptotic temperature, while the electromigration-prone cathode side of the feed line 104a is kept cool during a test process, for example. The cooling advantageously effectively suppresses electromigration in the feed line 104a.

Current 116 is supplied to the test structure 100 from the left of FIGS. 1 and 2 by applying the cathode of a current supply or current source to the left side of the feed line 104a. The current 116 runs upwardly through the first vias 108a and 108b, through the link 112, downwardly through the second or stressed via 108c, and through the stress line 104b to a current return applied at the right side of the stress line 104b. The current 116 may be introduced by applying a supply current and return to two test pads on the semiconductor device, for example, not shown.

Measurements of the electromigration effects of the test structure 100 are taken by sense lines (not shown in FIGS. 1 and 2) that make contact to each end of the stress line 104b and/or to either side of the at least one second via 108c, for example, by measuring the voltage and/or resistance of the stress line 104b and/or the at least one second via 108c.

Figure 3:
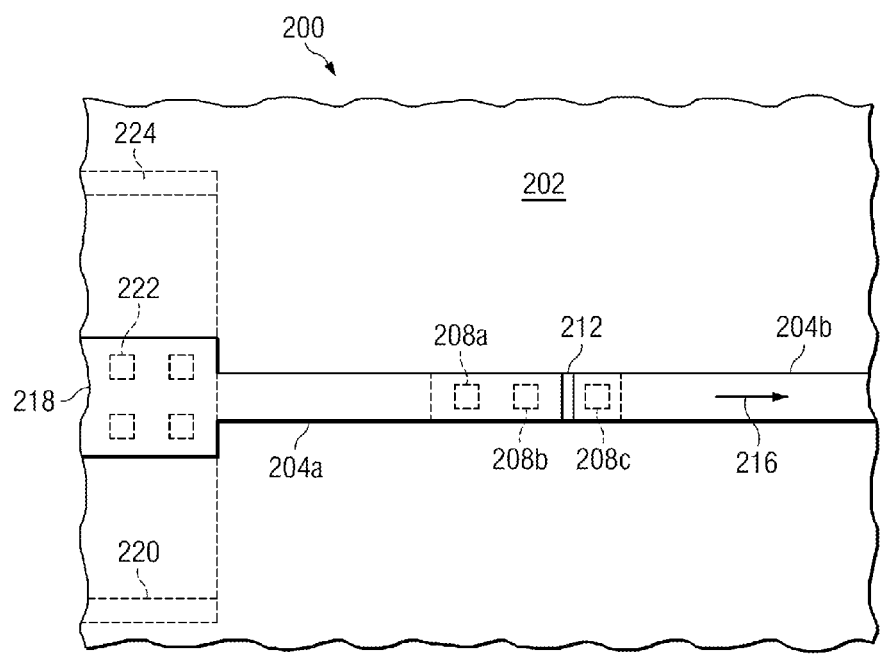
FIG. 3 is a top view of another preferred embodiment of the present invention, wherein one or more heatsinks are disposed at one end of the feed line.

FIG. 3 is a top view of another preferred embodiment of the present invention, wherein one or more heatsinks 218, 220, or 224 are disposed at an end of the feed line 204a opposite the end of the feed line 204a that is coupled to the link 212 by the at least one via 208a and 208b. Like numerals are used for the various elements that were described in FIGS. 1 and 2. To avoid repetition, each reference number shown in FIG. 3 is not described again in detail herein. Rather, similar materials are preferably used for the various element numbers x02, x04, x06, etc. . . . as were used to describe the element numbers in FIGS. 1 and 2, where x=1 in FIGS. 1 and 2, and x=2 in FIG. 3.

In this embodiment, optional heatsinks 218, 220, or 224 may be included in the test structure 200 at an opposite end of the feed line 204a than the end coupled to the at least one via 208a and 208b, which is coupled to the link 212. For example, a heatsink 218 may be formed in the same conductive material layer M1 that the feed line 204a is formed in. The heatsink 218 may comprise a wing-shaped region of conductive material disposed along the feed line 204a that is wider than the remainder of the length of the feed line 204a, for example, as shown. The heatsink 218 may be slightly wider than the feed line 204a or may be substantially wider than the feed line 204a, as shown at 220. A heatsink 224 may also be formed in the same conductive material layer M2 that the link 212 is formed in. The heatsink 224 may alternatively or may also be coupled to the feed line 204a by at least one third via 222 formed in the same conductive material layer V1 that the other vias 208a, 208b, and 208c are formed in, as shown.

The test structure 200 may include one heatsink 218 or 220 with no vias or heatsink 224. The test structure may include no heatsink 218 or 220 with vias 222 and one heatsink 224. Alternatively, the test structure 200 may include a heatsink 218 or 220 and may also a heatsink 224 and vias 222, for example.

In the embodiment shown in FIG. 3, electromigration in the feed line 204a may be eliminated or reduced by the selection of the length of feed line 204a and also by the heatsinks 218, 220, and/or 224. The heatsinks 218, 220 and/or 224 and the length of the feed line 204a may prevent or reduce material diffusion at the cathode side of the test structure 200, suppressing electromigration in the electromigration-prone part at the cathode side of the feed line 204a, for example. The heatsinks 218, 220, and/or 224 provide a conductive material reservoir at the left end of the feed line 204a so that heat is easily transported away from the left side of the test structure 200, for example. Thus, the heatsinks 218, 220 and/or 224 reduce the temperature on the left side of the test structure 200 during the test process, which may be performed at relatively high temperatures, e.g., at about 200 to 600 degrees C. This is an advantage because it is desirable in the test structure 200 to introduce electromigration in the stress line 204b and not introduce electromigration in the feed line 204a.

Figure 4:
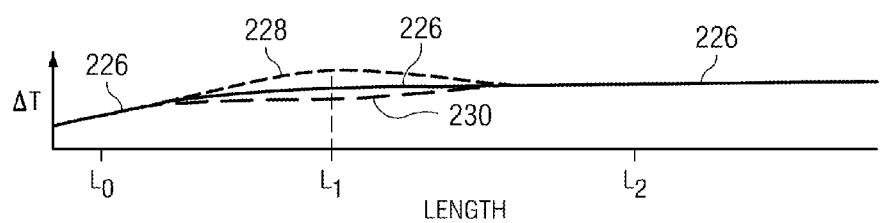
FIG. 4 is a graph of temperature change along the length of the test structures shown in FIGS. 1 through 3, wherein the temperature of the via and the test structure is made more uniform by embodiments of the present invention.

FIG. 4 is a graph of temperature change ($\Delta T$) along the length of the test structures 100 and 200 shown in FIGS. 1 through 3, wherein the temperature of the at least one second via 108c and 208c and the stress line 104b and 204b is made more uniform by embodiments of the present invention. Changes or increases in temperature along the length are due to Joule's heating, for example. The at least one second vias 108c and 208c comprise regions that have a potential to experience temperature variations due to the increased resistance of the vias 108c and 208c compared to the size of the feed lines 104a and 204a and stress line 104b and 204b. However, advantageously, the test structures 100 and 200 provide a homogeneous temperature along the length, due to forming the feed line 104a and 204a and stress line 104b and 204b in the same conductive material layer M1, and also due to the length of the feed line 104a and 204a, which functions as a heatsink, and further due to the use of the optional heatsinks 218, 220, and 224.

The graph 226 of FIG. 4 shows the temperature of conductive material layer M1 along the length, e.g., of the feed lines 104a and 204a at $L_0$, the temperature of the at least one second vias 108c and 208c at $L_1$, and the temperature of the stress lines 104b and 204b at $L_2$. Graph 226 depicts also the right side asymptotic temperature identity of lines 104a and 204a as compared to lines 104b and 204b. In addition, the graph at 228 shows overheating by the at least one second via 108c or 208c due to increased resistance of the at least one second via 108c or 208c compared to the feed line 104a and 204a and stress line 104b and 204b. This overheating of the test structures 100 and 200 may be offset, however, by the heat loss by a widened link 436 in some embodiments, such as the one shown in FIG. 7, to be described further herein, resulting in a steady increase in temperature through the test structures 100 and 200 at $L_1$ and homogeneous temperature at the vicinity of the at least one second vias 108c or 208c, shown at 226 at $L_1$, for example.

Figure 5:
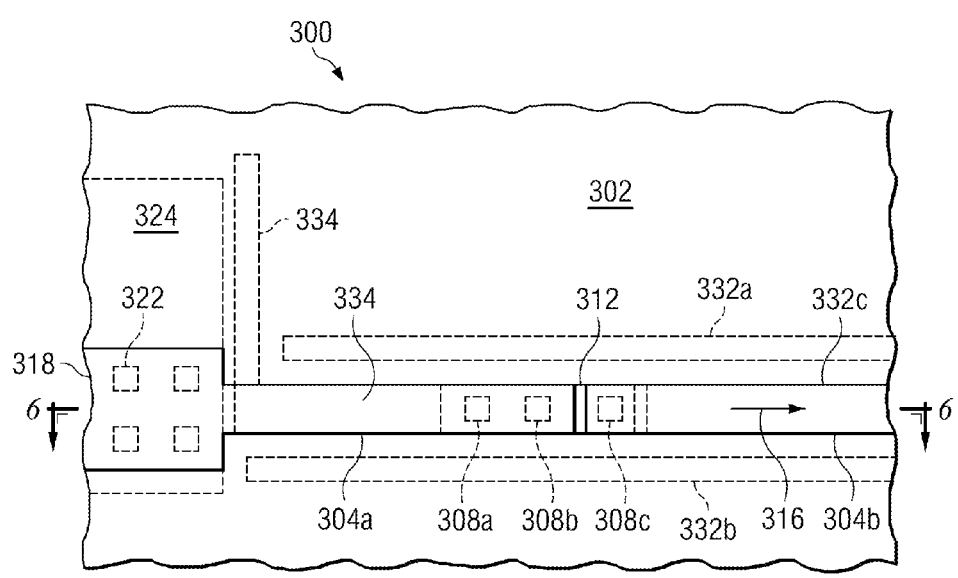
FIG. 5 shows a top view of another preferred embodiment of the present invention, wherein dummy conductive lines and/or sense lines are disposed proximate the stress line and/or feed line of the test structure.
Figure 6:
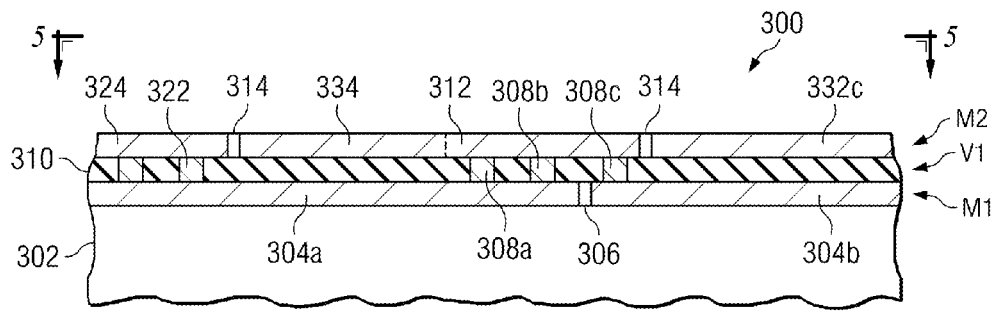
FIG. 6 shows a cross-sectional view of the test structure shown in FIG. 5.

FIG. 5 shows a top view of another preferred embodiment of the present invention, wherein dummy conductive lines 332a, 332b, and 332c and/or sense lines 334 are disposed proximate the stress line 304b and/or feed line 304a of the test structure 300. FIG. 6 shows a cross-sectional view of the test structure 300 shown in FIG. 5. Again, like numerals are used for the elements shown in FIGS. 5, 6, and subsequent figures of the present patent application as were used in the previous figures, and to avoid repetition, preferred materials and dimensions for the element numbers are not described again in detail herein.

As in the previous embodiments, the feed line 304a and stress line 304b are advantageously formed in the same conductive material layer M1, providing uniform cross-sectional dimensions for the feed line 304a and the stress line 304b. Optional dummy conductive lines 332a, 332b, and 332c are formed in the third conductive material layer M2, e.g., in the same conductive material layer M2 that the link 312 and the optional heatsink 324 are formed in. The dummy conductive lines 332a, 332b, and 332c are formed proximate the stress line 304b and/or the feed line 304a and extend parallel to the stress line 304b and/or the feed line 304a. The dummy conductive lines 332a, 332b, and 332c are advantageous because they further improve temperature uniformity around the feed via 308c when current 316 is run through the test structure 300. Alternatively, or additionally, dummy conductive lines may be formed proximate the stress line 304b and feed line 304b in the same conductive material layer M1 that the stress line 304b and the feed line 304a are formed in, for example, not shown in the drawings. The dummy conductive lines 332a, 332b, and 332c and other dummy conductive lines formed in layer M1 may comprise electrically inactive conductive lines for lithography or temperature uniformity improvement. Alternatively, the dummy conductive lines 332a, 332b, and 332c and others formed in layer M1 may comprise electrically active conductive lines that may be used for voltage sensing and/or extrusion detection.

As an example, conductive lines comprising sense lines, such as the sense line 334 formed proximate the feed line 304a shown in FIGS. 5 and 6, may be formed in the test structure 300 to further dissipate a portion of the heat generated in the stress line 304b and/or feed line 304a when current 316 is run through the test structure 300. In the test structure 300 shown, sense line 334 is coupled to an end of the link 312 in the third conductive material layer M2. Other sense lines 334 may also be implemented in the structure proximate the feed line 304a and/or the stress line 304b to function not only to take measurements of resistance and/or voltage during the electromigration test process, but also to assist in heat dissipation, for example, not shown.

Alternatively, optionally, the link 312 may be extended, e.g., along the length of the feed line 304a and/or the stress line 304b, for example (not shown), to assist in heat dissipation. The lengthening of the link 312 is similar to including dummy conductive lines in the test structure 300, for example.

The optional dummy conductive lines 332a, 332b, and 332c (and other dummy lines optionally alternatively or additionally formed in conductive layer M1) and strategically placed sense lines 334 shown in FIG. 5, or the elongated link 312 described herein, advantageously improve the temperature homogeneity of the novel test structure 300.

Figure 7:
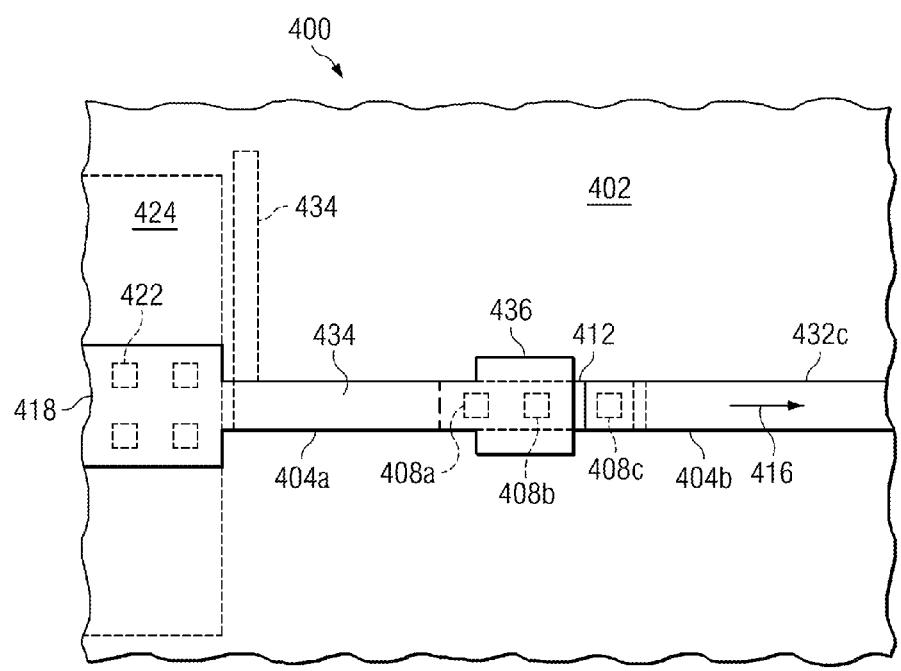
FIG. 7 shows a top view of yet another preferred embodiment of the present invention, wherein a heatsink is disposed proximate the vias between the feed line and the link.

In many applications, it may be desirable to reduce the temperature of the stressed vias 108c, 208c and 308c, which also results in the reduction of the temperature of the first vias 108a, 108b, 208a, 208b, 308a, and 308b. FIG. 7 shows a top view of yet another preferred embodiment of the present invention, wherein an optional heatsink 436 is disposed in a test structure 400 proximate the at least one first vias 408a and 408b between the feed line 404a and the link 412. The heatsink 436 may comprise a wing-shaped region of conductive material formed along the feed line 404a in the first conductive material layer M1, wherein the wing-shaped region is wider than the remainder of the length of the feed line 404a, for example, as shown. The heatsink 436 compensates for the heating of the at least one first vias 408a and 408b during an electromigration test process, for example. The first order approximation of the amount of temperature compensation may be calculated using Equation 1:

$$A_{heatsink}/A_{stress\ line} = (\Sigma R_{eff\_vias})/R_{stress\ line} \qquad \text{Eq. 1:}$$

wherein $A_{heatsink}$ is the area of the heatsink 436, $A_{stress\ line}$ is the area of the stress line 404b, $R_{eff\_vias}$ is the total effective resistance of all vias 408a, 408b, and 408c connecting the feed line 404a and the stress line 404b, and $R_{stress\ line}$ is the resistance of the stress line 404b, for example. Note that a Bilotti correction term may also be added depending on the heatsink 436 shape or finite element modeling may be applied. The size of the optional heatsink 436 may be determined by solving Equation 1 for the area of the heatsink 436, as shown in Equation 2:

$$A_{heatsink} = (\Sigma R_{eff\_vias})/R_{stress\ line} * A_{stress\ line} \qquad \text{Eq. 2:}$$

Note that in the embodiment shown in FIG. 7, dummy conductive lines may also be included (not shown in FIG. 7) proximate the stress line 404b or the feed line 404a, as shown in the embodiment of FIGS. 5 and 6.

Figure 8:
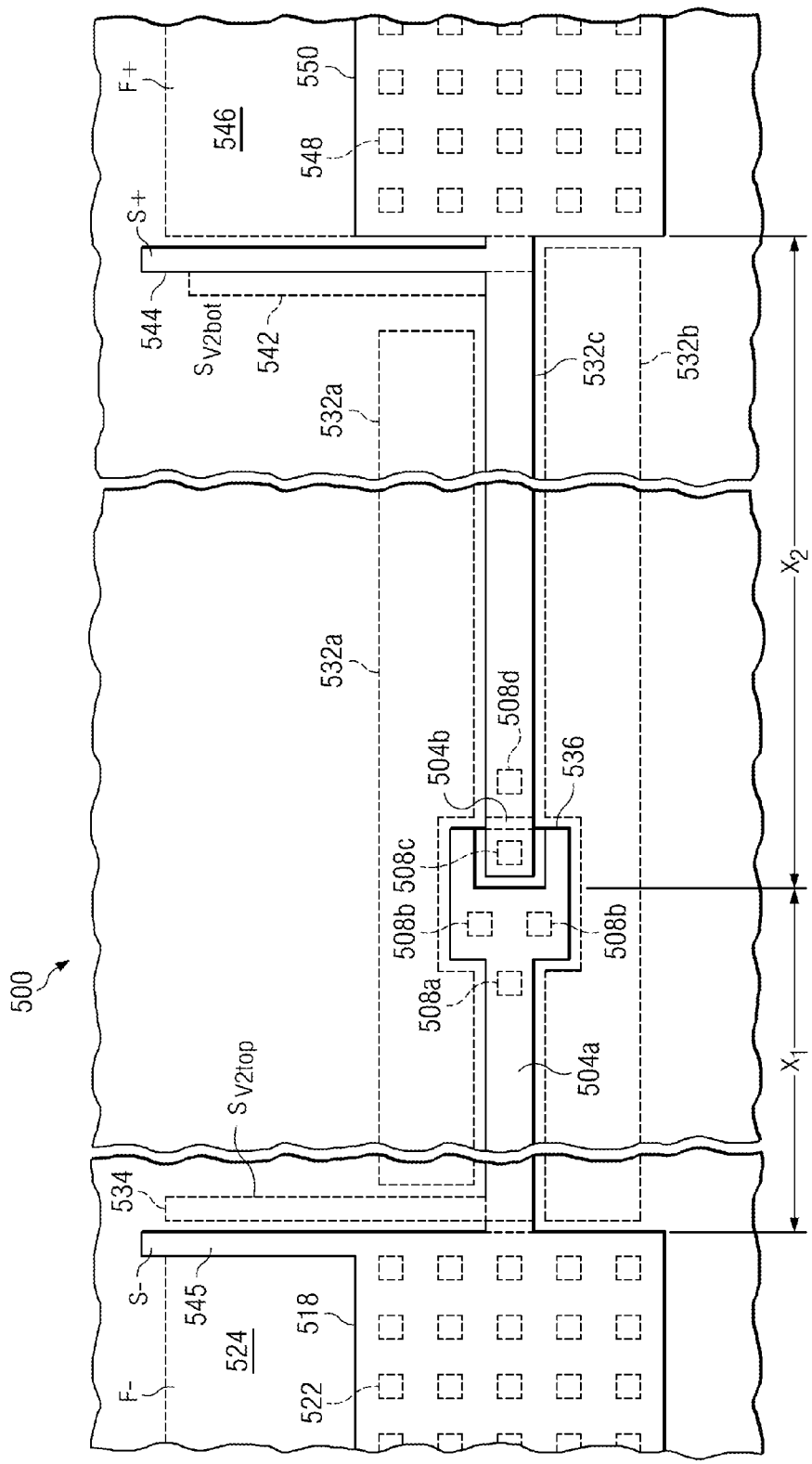
FIG. 8 shows a top view of a preferred embodiment of the present invention, wherein current is run in a downstream direction through a stressed via adjacent to the stress line.

In the embodiments shown in FIGS. 1, 2, 3, 5, 6, and 7, current 116, 216, 316, and 416 (indicating electron flow direction) is run through the test structures 100, 200, 300, and 400 in a downstream direction through at least one stressed via 108c, 208c, 308c, and 408c. FIG. 8 shows a top view of a preferred embodiment of the present invention, wherein current 516 is run also in a downstream direction through the stressed via (e.g., the at least one second via 504c) of the test structure 500. FIG. 9 is a cross-sectional view of the embodiment shown in FIG. 8. The term "downstream" is used herein to refer to a current flow that flows downwardly from a top surface of a semiconductor device towards lower levels of interconnect structures. Likewise, the term "upstream" is used herein to refer to a current flow that flows upwardly from lower levels of interconnect structures towards a top surface of a semiconductor device.

The embodiment shown in FIGS. 8 and 9 illustrates a preferred embodiment of the present invention wherein a current supply F− line is coupled at one side of the test structure 500 and a current return F+ line is coupled at the opposite side of the test structure 500. The current supply F− and return F+ generate the current 516 through the test structure 500 for the electromigration tests.

Sense lines 534, 542, 544, and 545 used for taking electromigration and other measurements are included in FIGS. 8 and 9, for example. Similarly placed sense lines 534, 542, 544, and 545 may also be included in the novel test structures 100, 200, 300, and 400 shown in the previous embodiments, for example.

The current supply F− may be applied by connecting a wire bond or by coupling a test probe or needle to a test pad of the test structure 500. The test pad may comprise the heatsink 524 or the test pad may comprise a contact formed in an upper metallization layer that is coupled to the heatsink 524, for example. The test structure 500 may include test pads 546 and 550 formed in the first conductive material layer M1 and the third conductive material layer M2, respectively, wherein the test pads 546 and 550 may be coupled together by at least one fourth via 548 formed in the second conductive material layer V1, for example, as shown.

Sense line 545 is coupled to the left side of the feed line 504a and signal S−. Sense line 534 is coupled to the top of the at least one second via 504c, e.g., represented by $S_{V2top}$. Sense line 542 is coupled to the bottom of the at least one second via 504c, represented by $S_{V2bot}$, e.g., through an additional via 508d and through a left portion of the stress line 504b. Sense line 544 is coupled to the right side of the stress line 504b and signal S+.

The resistance of the feed line 504a is obtainable by measuring the voltage drop across signals S− and $S_{V2top}$. The resistance of the at least one second via 508c is obtainable by measuring the voltage drop across signals $S_{V2top}$ and $S_{V2bot}$. The resistance of the stress line 504b is obtainable by measuring the voltage drop across signals $S_{V2bot}$ and S+. The resistance of the feed line 504a, the at least one second via 508c, and the stress line 504b may be altered due to electromigration effects, for example.

In particular, the electromigration of a semiconductor device, e.g., a semiconductor device the test structure 500 is manufactured in, may be determined by measuring the resistance of the stress line 504b while a current 516 is run through the test structure 500. Also, region 540 of FIG. 9 may be of particular interest in some applications, because voids may tend to form in region 540 as a result of electromigration in the stress line 504b. The resistance across the at least one second via 508c may be used to detect defects in or nearby the at least one second via 508c; e.g., if voids have formed, the measured voltage will increase between signals $S_{V2top}$ and $S_{V2bot}$. Also, the voltage drop across the at least one second via 508c may be measured while current is run through the at least one second via 508c, and the resistance of the at least one second via 508c may be calculated. At the beginning of the test, the at least one second via 508c resistance can be used to determine the temperature of the at least one second via 508c under stress current 516, and the temperature of the stress line 504b can be determined, if the thermal coefficient of resistance (TCR) of the material of the stress line 504b and stressed vias 508c are known or pre-measured, for example.

The thermal length $x_1$ of the feed line 504a may comprise about 40 μm, and the length $x_2$ of the stress line 504b may comprise about 300 μm, as examples, although alternatively, the lengths $x_1$ and $x_2$ may comprise other dimensions.

Figure 10:
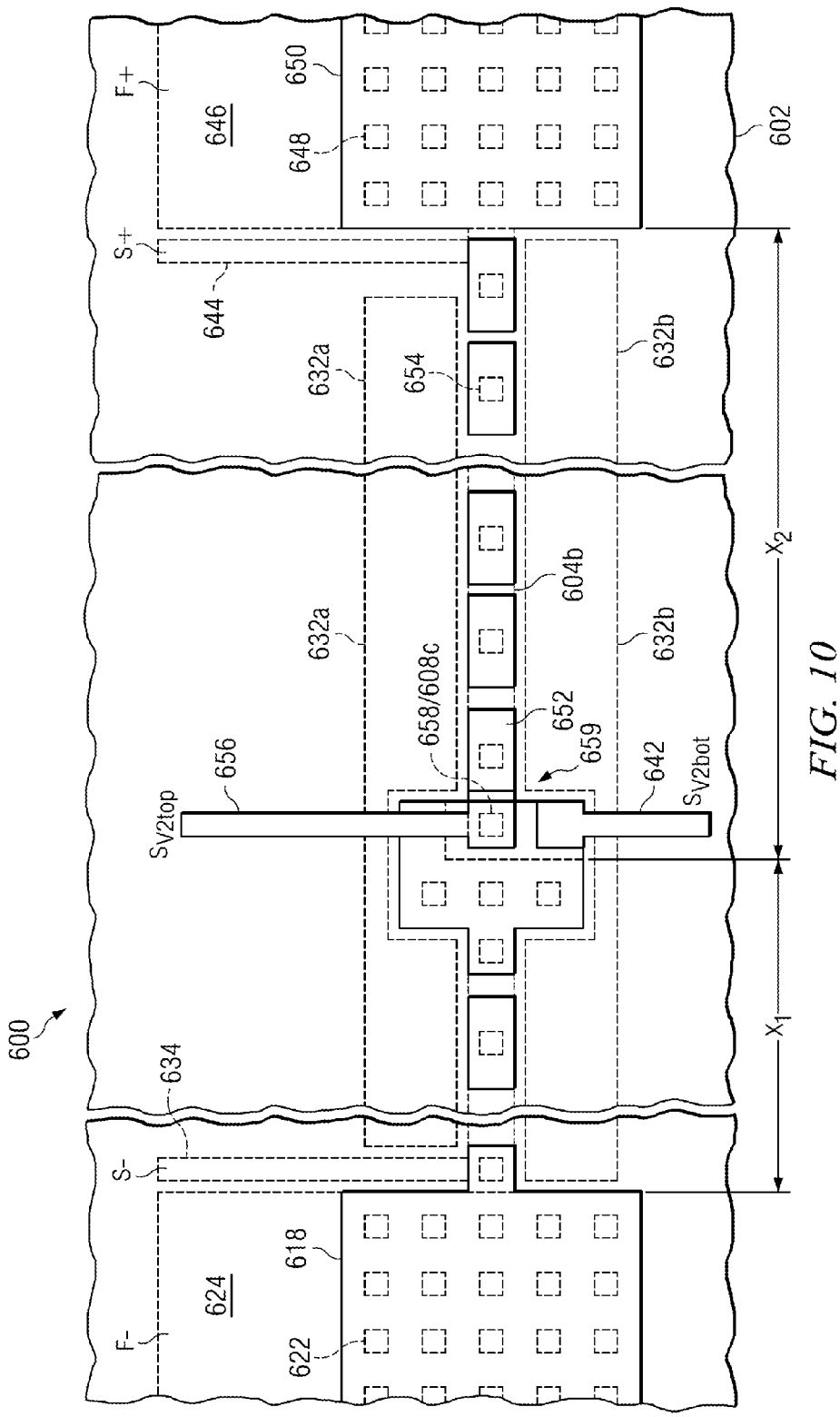
FIG. 10 shows a top view of a preferred embodiment of the present invention, wherein current is run in an upstream direction through the stressed via.

FIG. 10 shows a top view of a preferred embodiment of the present invention, wherein current 616 is run in an upstream direction through the stressed via 608c to perform electromigration tests. FIG. 11 is a cross-sectional view of the embodiment shown in FIG. 10. As in the embodiment shown in FIGS. 8 and 9, a current supply F− line is coupled at one side of the test structure 600 and a current return F+ line is coupled at the opposite side of the test structure 600. However, in this embodiment, two more conductive material layers V2 and M3 are used in the test structure 600. Sense lines 642 and 656 are formed in a fifth conductive material layer M3, wherein the sense lines 642 and 656 are used to couple to the bottom of the at least one second via 604c (at $S_{V2bot}$) and the top of the at least one second via 604c (at $S_{V2top}$), respectively, through vias 658 in a fourth conductive material layer V2 disposed over the third conductive material layer M2. The sense line 642 is preferably coupled to the link 612 in region 659 at the bottom of the at least one second via 608c through vias formed in the second conductive material layer V1, the third conductive material layer M2, and the fourth conductive material V2, for example.

In this embodiment, the link 612 is formed in the first conductive material layer M1, and the feed line 604a and the stress line 604b are formed in the third conductive material layer M2, wherein the first and third conductive material layers M1 and M3 may comprise conductive line layers of a multi-level interconnect system of a semiconductor device. The connections (e.g., vias 608a, 608b, and stressed via 608c) between the link 612 and the feed line 604a and stress line 604b are formed in the second conductive material layer V1 which may comprise a via level of the multi-level interconnect system. Thus, the test structure 600 shown in FIGS. 10 and 11 is "upside-down" compared to the previously described test structures 100, 200, 300, 400, and 500. The region of most interest in some applications is region 659 where current 616 is run in an upstream direction through the at least one second via 608c; e.g., region 659 comprises the stressed via 608c where voids may form due to electromigration along the stress line 604b.

In this embodiment, optional dummy conductive lines 652 are segmented in the first conductive material layer M1 and are coupled along the length of the feed line 604a and the stress line 604b to the feed line 604a and the stress line 604b at predetermined locations by vias 654 formed in the second conductive material layer V1. Preferably, the distance between vias 654 along the feed line 604a and the stress line 604b are substantially the same, to promote temperature homogeneity in the test structure 600. Coupling the segmented dummy conductive lines 652 to the feed line 604a and the stress line 604b provides a uniform heatsink along the feed line 604a and the stress line 604b, for example. The segmented dummy conductive lines 652 are adapted to transport heat downwards towards the substrate or workpiece 602.

Figure 12:
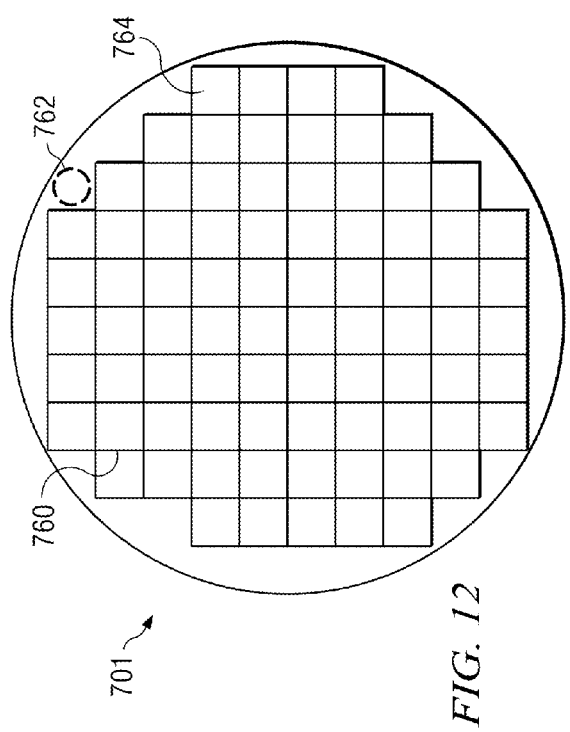
FIG. 12 is a top view of a semiconductor wafer, illustrating that the novel test structures of embodiments of the present invention may be formed in a scribe line region or a die region of a semiconductor wafer.

FIG. 12 is a top view of a semiconductor wafer 701, illustrating that the novel test structures 100, 200, 300, 400, 500, and 600 (and also the test structures 700 and 800 shown in FIGS. 13 through 15) of embodiments of the present invention may be formed in a scribe line region 760, an incompletely formed die region 762, or a die 764 region of a semiconductor wafer 701. The novel test structures 100, 200, 300, 400, 500, 600, 700, and 800 described herein may be located at scribe line regions 760 between individual die 764, wherein the die 764 comprise functional or test semiconductor devices, as examples. In this embodiment, the test structures 100, 200, 300, 400, 500, 600, 700, and 800 are sacrificial structures that are destroyed and/or discarded after the die 764 of the semiconductor wafer 701 are singulated. In other embodiments, the test structures 100, 200, 300, 400, 500, 600, 700, and 800 may be formed in the unused or incompletely formed die regions 762 of the semiconductor wafer 701, and the test structures 100, 200, 300, 400, 500, 600, 700, and 800 may be discarded after electromigration tests are performed and the die 764 of the semiconductor wafer 701 are singulated. In other embodiments, the test structures 100, 200, 300, 400, 500, 600, 700, and 800 may be formed in predetermined, dedicated die 764 regions, and the die 764 comprising the test structures 100, 200, 300, 400, 500, 600, 700, and 800 may or may not be discarded after singulation of the die 764, for example. The test structures 100, 200, 300, 400, 500, 600, 700, and 800 may also be formed in an unused region of a die 764, a test region of a die 764, or combinations thereof with the other regions 760, 762, or 764 described herein, as examples.

Embodiments of the present invention also include semiconductor wafers 701 and semiconductor devices that include the novel test structures 100, 200, 300, 400, 500, 600, 700, and 800 described herein, for example.

Figure 13:
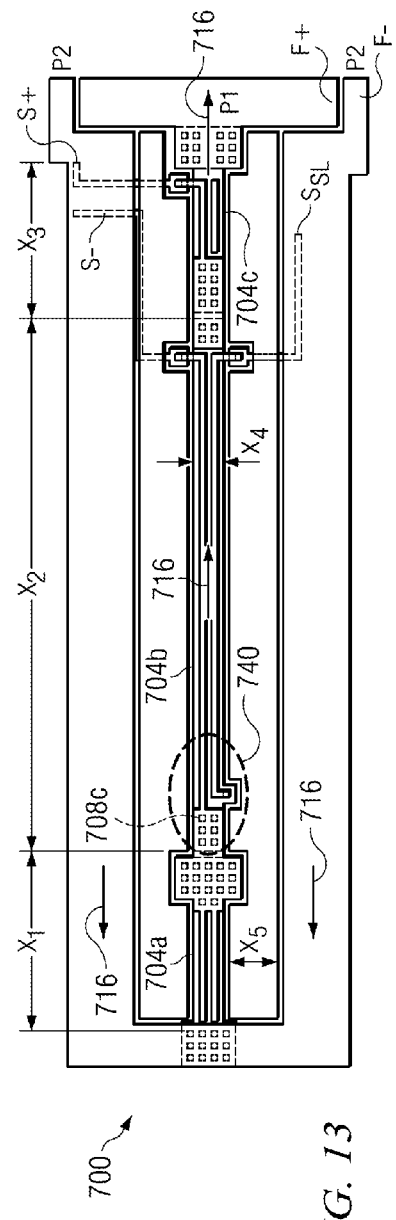
FIG. 13 shows a top view of yet another preferred embodiment of the present invention, wherein current is run in a downstream direction through the stressed via and wherein the current supply and return are disposed on one side of the test structure.

FIG. 13 shows a top view of yet another preferred embodiment of the present invention, wherein current 716 is run in a downstream direction through the stressed vias 708c in stressed region 740, and wherein the current supply and return F− and F+ lines are disposed on one side, e.g., the right side, of the test structure 700. An additional segment of conductive material 704c comprising a length $x_3$ for supplying the current return F+ is disposed in the first conductive material layer M1 to the right of the stress line 704b in this embodiment, coupled to the structure using vias 708d, for example. The thermal length $x_1$ of the feed line 704a may comprise about 60 μm, and the length $x_2$ of the stress line 704b may comprise about 300 μm, as examples. Length $x_3$ may comprise about 10 μm or less, for example. The width $x_4$ of the stress line 704b may comprise about 3 μm, for example. Two adjacent dummy lines of minimum width (e.g., about 0.5 μm) may function as a heat equalizer in the length direction and/or extrusion monitors, as an example. The width $x_5$ of the current supply lines disposed in the third conductive material layer M3 may comprise about 3 μm, for example. Alternatively, the dimensions $x_1$, $x_2$, $x_3$, $x_4$, and $x_5$ may comprise other dimensions. This embodiment is advantageous in that all test and current supply/return pads P1 and P2 may be located on one side of the test structure 700, for example.

Figure 14:
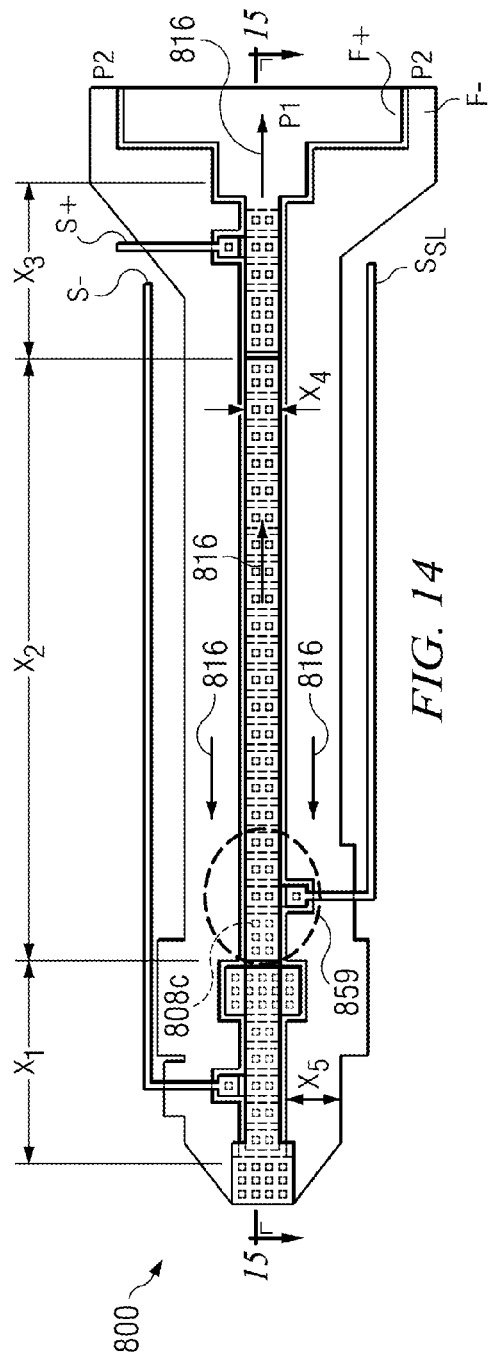
FIG. 14 shows a top view of another preferred embodiment of the present invention, wherein current is run in an upstream direction through the stressed via and wherein the current supply and return are disposed on one side of the test structure.
Figure 15:
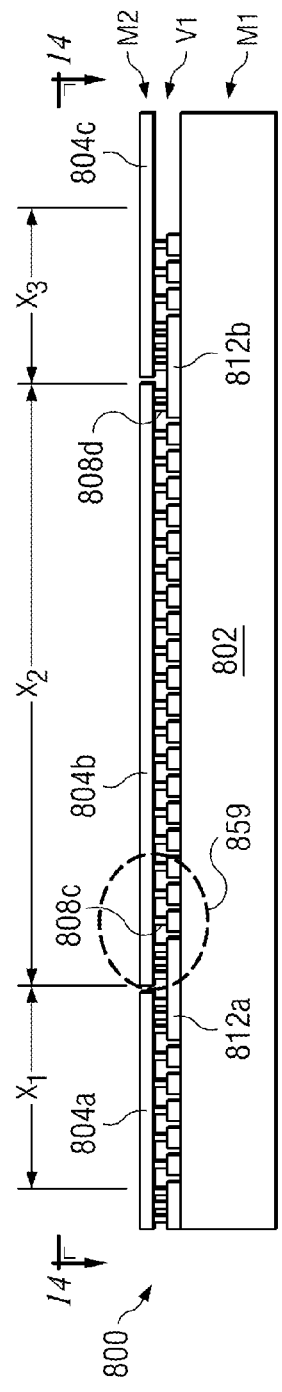
FIG. 15 is a cross-sectional view of the embodiment shown in FIG. 14.

FIG. 14 shows a top view of another preferred embodiment of the present invention, wherein current 816 is run in an upstream direction through the stressed vias 808c in stressed region 859, and wherein the current supply and return F− and F+ lines are advantageously disposed on one side of the test structure 800. FIG. 15 is a cross-sectional view of the embodiment shown in FIG. 14. The structure shown in FIGS. 14 and 15 includes two links 812a and 812b formed in a first conductive material layer M1, for example, wherein vias 808d couple the link 812b to the third segment 804c that is coupled to the current return F+ line. The link 812a coupling the feed line 804a to the stress line 804b may comprise a length of about 5 μm, for example, although alternatively, the link 812a may comprise other dimensions.

Embodiments of the present invention include methods of manufacturing the test structures 100, 200, 300, 400, 500, 600, 700, and 800 described herein. Embodiments of the present invention also include test methods using the novel test structures 100, 200, 300, 400, 500, 600, 700, and 800 described herein, for example. Forming the feed lines 104a, 204a, 304a, 404a, 504a, 604a, 704a, and 804a and the stress lines 104b, 204b, 304b, 404b, 504b, 604b, 704b, and 804b in the same conductive material layer advantageously provides temperature homogeneity in the stress lines 104b, 204b, 304b, 404b, 504b, 604b, 704b, and 804b, a portion of the feed lines 104a, 204a, 304a, 404a, 504a, 604a, 704a, and 804a, and a portion of the conductive feature connecting the feed line to the stress line, e.g., in the stressed vias 108c, 208c, 308c, 408c, 508c, 608c, 708c, and 808c. The temperature homogeneity of the test structures 100, 200, 300, 400, 500, 600, 700, and 800 is advantageously invariant against a majority of process fluctuations (such as variations in the thickness and/or width of the conductive material layers and dielectric material layers the portions of the test structures 100, 200, 300, 400, 500, 600, 700, and 800 are formed in) while applying highly accelerating electromigration stress current. Stress and electromigration measurement current (if different) may be applied alternatingly in the test structures 100, 200, 300, 400, 500, 600, 700, and 800, for example.

The temperature homogeneity of the novel test structures 100, 200, 300, 400, 500, 600, 700, and 800 advantageously allows acceleration of the testing times, by increasing the amount of current run through the test structures 100, 200, 300, 400, 500, 600, 700, and 800, for example, while still keeping temperature uniformity along the stress via and stress line. Thus, the time required for electromigration tests and measurements may be reduced in accordance with embodiments of the present invention. A first current $I_1$ may be used for a first time period $t_1$, or a second current $I_2$ may be used for a second time period $t_2$, wherein the second current $I_2$ is greater than the first current $I_1$, and wherein the second time period $t_2$ is less than the first time period $t_1$, for example. The second time period $t_2$ may comprise about 30 minutes or less, although the tests may also be performed for other time periods. Accelerated test time periods down to minutes may be reached while keeping the stressed via and the stress line of the test structures at the same temperature, for example. The amount of current 116, 216, 316, 416, 516, 616, 716, or 816 used in the test structures 100, 200, 300, 400, 500, 600, 700, and 800 is a function of the width and thickness of the portions of the test structures 100, 200, 300, 400, 500, 600, 700, and 800, for example. Current densities on the order of about several tens of A/cm$^2$ or so may be used, although smaller or larger current densities may also be used. The current density used may vary according to the ambient temperature the tests are performed in, for example. Reduced test times down to a few minutes can be reached, although smaller or higher test times may also be used.

The electromigration tests using the novel test structures 100, 200, 300, 400, 500, 600, 700, and 800 of embodiments of the present invention may be performed during the technology development phase of semiconductor devices, e.g., to test and improve electromigration in conductive material layers of semiconductor devices or the test structures 100, 200, 300, 400, 500, 600, 700, and 800 may be used for technology qualification tests. Alternatively, the electromigration tests may be performed occasionally or periodically during production (e.g., for production reliability monitoring), after a predetermined number of lots or wafers, or on each lot or wafer, as examples. The tests may be used on wafer-level or package-level tests, for example.

Advantageously, the temperature of the stressed vias 108c, 208c, 308c, 408c, 508c, 608c, 708c, and 808c and/or the stress lines 104b, 204b, 304b, 404b, 504b, 604b, 704b, and 804b of the test structures 100, 200, 300, 400, 500, 600, 700, and 800 may be determined, by using the sense lines described herein. In some tests, for example, the goal may be to obtain the same temperature or a predetermined temperature difference in the stressed vias and the stress line of the test structures. Thus, the temperature of the stressed via and the stress line may be obtained using the test structures, and the two temperatures may be compared, and the testing may be modified, e.g., by increasing or decreasing the current or test times, accordingly. Alternatively, the temperature of only the stressed vias or only the stress line of the novel test structures 100, 200, 300, 400, 500, 600, 700, and 800 may be measured, for example.

Advantages of embodiments of the present invention include providing test structures 100, 200, 300, 400, 500, 600, 700, and 800 and methods for quickly and accurately measuring the effects of electromigration of semiconductor devices. Electromigration tests using the novel test structures 100, 200, 300, 400, 500, 600, 700, and 800 enable the user to accelerate the tests, because the novel test structures 100, 200, 300, 400, 500, 600, 700, and 800 assure temperature homogeneity up to higher currents than conventional test structures. Precise wafer-level tests may be performed in a few seconds or minutes or less, e.g., in about 100 to 1,000 seconds or less, increasing throughput and providing a cost savings. Also, package-level tests may be accelerated from days to convenient tests times below one day using the novel test structures 100, 200, 300, 400, 500, 600, 700, and 800. The tests may be performed using high stress, e.g., high stress line temperature and high current. The ambient temperatures may comprise room temperature to about 200 to 300 degrees C. for aluminum conductive line structures and up to about 400 degrees C. for copper conductive line structures, as examples, although alternatively, the test temperatures may comprise other temperatures. Including Joule's heating, the stress line and stress via temperatures can reach temperatures of about 350° C. for aluminum conductive structures and about 600° C. for copper conductive structures, for example. The test results are also more reliable, due to the various heat-dissipating features of the novel test structures 100, 200, 300, 400, 500, 600, 700, and 800 described herein, providing uniform temperature profiles along the stressed vias and stress lines.

The test structures 100, 200, 300, 400, 500, 600, 700, and 800 provide a uniform temperature profile along the stressed via and stress line due to process invariant temperature matching at the feed line and the stress line. Hot spots at the stressed via site in-between the feed line and the stress line are avoided by using heat dissipation wings. Because the feed lines and the stress lines are formed in the same conductive material layer, variations in temperature profile due to process variations (e.g., in the width and height of the conductive layers and thickness of dielectric layers) are eliminated. The temperature profiles across the length of the test structures 100, 200, 300, 400, 500, 600, 700, and 800 are self-adjusting because the feed lines and stress lines are formed in the same conductive material layer.

Embodiments of the present invention may be implemented in many types of test structure configurations, using upstream and downstream current flow through stressed vias adjacent the stress lines, for example.

Optional heatsinks, active or inactive dummy conductive lines, and/or segmented dummy conductive lines may be implemented in the test structure to provide thermal dissipation and improve reliability of the electromigration test results. Implementing heatsinks and/or wing structures along the feed line freezes material diffusion along the feed line and effectively suppresses electromigration along the feed line of the test structures, for example. Placing wing structures proximate the stressed via connections compensates for increased Joule's heating of the vias, e.g., the stressed vias 108c, 208c, 308c, 408c, 508c, 608c, 708c, and 808c.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of testing a semiconductor device, the method comprising:
    running a current through a test structure in the semiconductor device, the test structure comprising:
        a feed line having a first and a second end disposed in a first conductive material layer,
        a stress line disposed in the first conductive material layer proximate the feed line but spaced apart from the feed line, the stress line being coupled to the feed line by a conductive feature disposed in at least one second conductive material layer proximate the first conductive material layer, and
        a first thermal heatsink disposed in the first conductive material layer, the first thermal heatsink having a wing-shaped region, the wing-shaped region being wider than a width of the feed line;
        a second thermal heatsink disposed in a third conductive material layer, wherein a via in the second conductive material layer physically contacts the first and the second thermal heatsinks; and
    measuring an amount of electromigration of a portion of the test structure.

2. The method according to claim 1, wherein measuring the amount of electromigration of the portion of the test structure comprises measuring an effect of electromigration within the stress line.

3. The method according to claim 1, wherein measuring the amount of electromigration of the portion of the test structure comprises measuring an effect of electromigration of a portion of the conductive feature coupling the stress line to the feed line.

4. The method according to claim 1, wherein measuring the amount of electromigration of the portion of the test structure comprises measuring a first effect of electromigration within the stress line and measuring a second effect of electromigration of a portion of the conductive feature coupling the stress line to the feed line, and comparing the first effect of electromigration within the stress line to the second effect of electromigration of the portion of the conductive feature coupling the stress line to the feed line.

5. The method according to claim 1, wherein temperature homogeneity is achieved in the stress line, a portion of the feed line, and at least a portion of the connecting conductive feature, wherein the temperature homogeneity is invariant against a majority of process fluctuations while applying accelerating electromigration stress current.

6. A method of testing a semiconductor device, the method comprising:
    running a current through a test structure in the semiconductor device, the test structure comprising:
        a feed line having a first and a second end and a stress line disposed in a first conductive material layer;
        at least one first via coupled to the second end of the feed line and at least one second via coupled to the stress line disposed in a second conductive material layer adjacent to the first conductive material layer;
        a link between the at least one first via and the at least one second via disposed in a third conductive material layer adjacent to the second conductive material layer;
        a first thermal heatsink physically contacting the first end of the feed line, the first thermal heatsink having a wing-shaped region, the wing-shaped region being wider than a width of the feed line, wherein the first thermal heatsink is disposed in the first conductive material layer; and
        a second thermal heatsink disposed in the third conductive material layer, wherein at least one third via in the second conductive material layer physically contacts the second thermal heatsink and the first thermal heatsink; and
    measuring an amount of electromigration of a portion of the test structure.

7. The method according to claim 6, wherein measuring the amount of electromigration of the portion of the test structure comprises measuring an effect of electromigration within the stress line.

8. The method according to claim 6, wherein measuring the amount of electromigration of the portion of the test structure comprises measuring an effect of electromigration of a portion of the link.

9. The method according to claim 6, wherein measuring the amount of electromigration of the portion of the test structure comprises measuring a first effect of electromigration within the stress line and measuring a second effect of electromigration of a portion of the link, and comparing the first effect of electromigration within the stress line to the second effect of electromigration of the link.

10. The method according to claim 6, wherein temperature homogeneity is achieved in the stress line, a portion of the feed line, and at least a portion of the link, wherein the temperature homogeneity is invariant against a majority of process fluctuations while applying accelerating electromigration stress current.

11. The method according to claim 6, wherein a thermal heatsink is disposed proximate the second end of the feed line in the first conductive material layer.

12. A method of testing a semiconductor device, the method comprising:
running a current through a test structure in the semiconductor device, the test structure comprising:
a first conductive line disposed in a first conductive material layer;
a second conductive line having a first end and a second end disposed in the first conductive material layer;
at least one first conductive via disposed in a second conductive material layer, the second conductive material layer being adjacent to the first conductive material layer, the at least one first conductive via being coupled to the first conductive line;
at least one second conductive via disposed in the second conductive material layer, the at least one second conductive via being coupled to the first end of the second conductive line;
a third conductive line disposed in a third conductive material layer, the third conductive material layer being adjacent to the second conductive material layer, the third conductive line being coupled at a first end to the at least one first conductive via and coupled at a second end to the at least one second conductive via;
a first sense line coupled to the second end of the third conductive line and a second sense line coupled to the first end of the second conductive line; and
a third sense line coupled to the second end of the second conductive line; and
measuring an amount of electromigration of a portion of the test structure.

13. The method of claim 12, wherein measuring the amount of electromigration of the portion of the test structure comprises passing a current through the first conductive line, the at least one first conductive via, the third conductive line, the at least one second conductive via,
and the second conductive line, and measuring the current in the second conductive line or in the at least one second conductive via.

14. The method of claim 12, wherein measuring the amount of electromigration of the portion of the test structure comprises measuring electromigration in the second conductive line using the second and the third sense lines.

15. The method of claim 12, wherein measuring the amount of electromigration of the portion of the test structure comprises applying a current passing from the first conductive line and returning from the second conductive line.

* * * * *